United States Patent
Ao et al.

(10) Patent No.: US 11,171,269 B2
(45) Date of Patent: Nov. 9, 2021

(54) LIGHT EMITTING DEVICE

(71) Applicant: TOYODA GOSEI CO., LTD., Kiyosu (JP)

(72) Inventors: Koji Ao, Kiyosu (JP); Hiroshi Ito, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/528,835

(22) Filed: Aug. 1, 2019

(65) Prior Publication Data

US 2020/0083413 A1 Mar. 12, 2020

(30) Foreign Application Priority Data

Sep. 11, 2018 (JP) .............................. JP2018-169834

(51) Int. Cl.
*H01L 33/52* (2010.01)
*H01L 33/48* (2010.01)

(52) U.S. Cl.
CPC ............ *H01L 33/52* (2013.01); *H01L 33/486* (2013.01)

(58) Field of Classification Search
CPC ........... H01L 23/562–564; H01L 33/44; H01L 33/52–56; H01L 33/483–486
See application file for complete search history.

(56) References Cited

U.S. PATENT DOCUMENTS

| 8,772,802 B2 * | 7/2014 | Tsai ........................ H01L 33/58 257/98 |
| 8,841,690 B1 * | 9/2014 | Kim ........................ H01L 33/54 257/98 |
| 9,450,159 B2 | 9/2016 | Jung et al. | |
| 2006/0108594 A1 * | 5/2006 | Iwasaki ................... H01L 33/58 257/98 |

(Continued)

FOREIGN PATENT DOCUMENTS

| JP | 2013/187052 A | 9/2013 |
| JP | 2014-532986 A | 12/2014 |

(Continued)

OTHER PUBLICATIONS

Japanese Office Action, dated Sep. 14, 2021, in Japanese Patent Application No. 2018-169834 and English Translation thereof.

*Primary Examiner* — Latanya N Crawford Eason
(74) *Attorney, Agent, or Firm* — McGinn I.P. Law Group, PLLC.

(57) ABSTRACT

A light emitting device includes a substrate, a light emitting element mounted on the substrate, an uninterrupted annular sealing member installed in such a manner as to surround the light emitting element, a waterproof sheet installed in such a manner as to cover an upper side of the light emitting element and the sealing member, and transmit light emitted from the light emitting element, and an uninterrupted annular cover installed on the waterproof sheet, with a region of the cover being open above the light emitting element. The waterproof sheet is being fixed by sandwiching the water- (Continued)

proof sheet between the sealing member and the cover. A mounting region for the light emitting element on the substrate, which is being laterally surrounded by the sealing member while being covered by the waterproof sheet, is being hermetically sealed.

20 Claims, 8 Drawing Sheets

(56) References Cited

U.S. PATENT DOCUMENTS

| | | | | |
|---|---|---|---|---|
| 2009/0154164 | A1* | 6/2009 | Hsu | F21V 29/83 |
| | | | | 362/267 |
| 2014/0284650 | A1 | 9/2014 | Jung et al. | |
| 2015/0318449 | A1* | 11/2015 | Rantala | H01L 33/32 |
| | | | | 257/76 |
| 2016/0356485 | A1* | 12/2016 | Matsuoka | F21V 17/101 |
| 2017/0062669 | A1* | 3/2017 | Yamasuge | H01L 33/507 |
| 2019/0245117 | A1* | 8/2019 | Kim | H01L 33/62 |
| 2019/0355877 | A1* | 11/2019 | Kim | H01L 33/486 |
| 2020/0041115 | A1* | 2/2020 | Kim | H01L 33/48 |

FOREIGN PATENT DOCUMENTS

| | | |
|---|---|---|
| JP | 2015-220435 A | 12/2015 |
| WO | 2018/147688 A1 | 8/2018 |

* cited by examiner

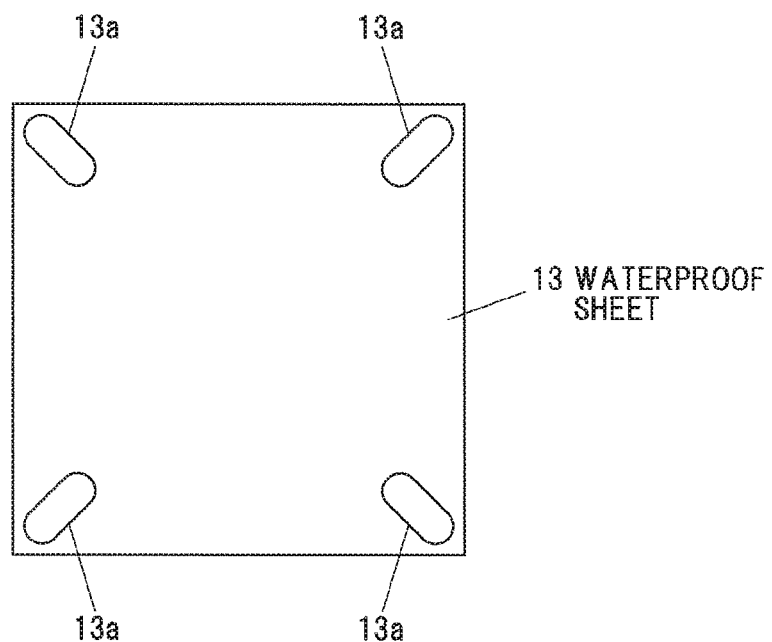

LIGHT EMITTING DEVICE

BACKGROUND OF THE INVENTION

1. Field of the Invention

The present invention relates to a light emitting device.

2. Description of the Related Art

Conventionally, there is known a technique for hermetically sealing an LED (Light Emitting Diode) in order to ensure waterproofness, by use of a transparent member such as quartz or sapphire (see, for example, Patent Document 1).

According to the technique described in Patent Document 1, by providing an air discharge passage in an LED package main body, when adhering the transparent member to the LED package main body, it is possible to prevent the separation of the transparent member from the LED package main body due to internal air pressure of the transparent member. After the transparent member is adhered to the LED package main body, in order to prevent the ingress of moisture and the like into the transparent member, the air discharge passage is blocked by a sealing material.

Also, conventionally, there is known an LED module which has a waterproof film which covers a plurality of LEDs mounted on a module substrate, and an upper surface of a spacer which fills a space between those LEDs (see Patent Document 2, for example). The waterproof film is being adhesively fixed to the LED and the spacer by thermal fusion bonding, vacuum adsorption, or bonding using an adhesive.

[Patent Document 1] JP-A-2014-532986
[Patent Document 2] JP-A-2015-220435

SUMMARY OF THE INVENTION

In the technique of Patent Document 1, although it is possible to address the internal pressure variation of the transparent member when adhering the transparent member to the LED package main body, it is not possible to address a pressure variation at the time of operation of the LED package with the air discharge passage being blocked by the seal material. For this reason, the separation of the waterproof film from the LED package main body may occur, depending on an ambient temperature at which the LED package is used.

Moreover, the LED module of Patent Document 2 is difficult to use in water, because when that LED module is immersed in water, the separation of the waterproof film may be caused by water pressure and the like.

An object of the present invention is to provide a light emitting device that is resistant to pressure variation in a hermetically sealed mounting region for a light emitting element, and that is waterproofed to be usable in water as well.

One aspect of the present invention provides light emitting devices defined by [1] to [6] below, to achieve the above object.

[1] A light emitting device, including: a substrate; a light emitting element mounted on the substrate; an annular sealing member installed in such a manner as to surround the light emitting element; a waterproof sheet installed in such a manner as to cover an upper side of the light emitting element and the sealing member, and transmit light emitted from the light emitting element; and an annular cover installed on the waterproof sheet, with a region of the cover being open above the light emitting element, wherein the waterproof sheet is being fixed by sandwiching the waterproof sheet between the sealing member and the cover, wherein a mounting region for the light emitting element on the substrate, which is being laterally surrounded by the sealing member while being covered by the waterproof sheet, is being hermetically sealed.

[2] The light emitting device according to [1] above, further including a light intercepting member, which covers a side surface of the waterproof sheet to intercept the light emitted from the light emitting element.

[3] The light emitting device according to the above [1] or [2], further including a side wall, which is installed between the light emitting element and the sealing member, wherein the side wall is greater in height than the light emitting element, with an upper end of the side wall being in contact with the waterproof sheet.

[4] The light emitting device according to any one of the above [1] to [3], further including a lens, which covers the upper side of the light emitting element, with an upper surface of the lens being in contact with the waterproof sheet, with the lens to transmit the light emitted from the light emitting element, wherein a position of the lens is being fixed with the waterproof sheet.

[5] A light emitting device according to any one of the above [1] to [4], wherein the sealing member is being compressed in a thickness direction, and a thickness of the sealing member after being compressed is 65 to 95% of that before being compressed.

[6] A light emitting device according to any one of the above [1] to [5], wherein the light emitting element is a sterilizer that emits ultraviolet light.

Points of the Invention

According to the present invention, it is possible to provide the waterproof light emitting devices that are resistant to pressure variation in the hermitically sealed mounting region for the light emitting element, and that are waterproofed to be usable in water as well.

BRIEF DESCRIPTION OF THE DRAWINGS

FIG. 5 is a plan view of a modification to a waterproof sheet according to the first embodiment;

DETAILED DESCRIPTION OF THE PREFERRED EMBODIMENTS

First Embodiment (Light Emitting Device Configuration)

Figure 1:
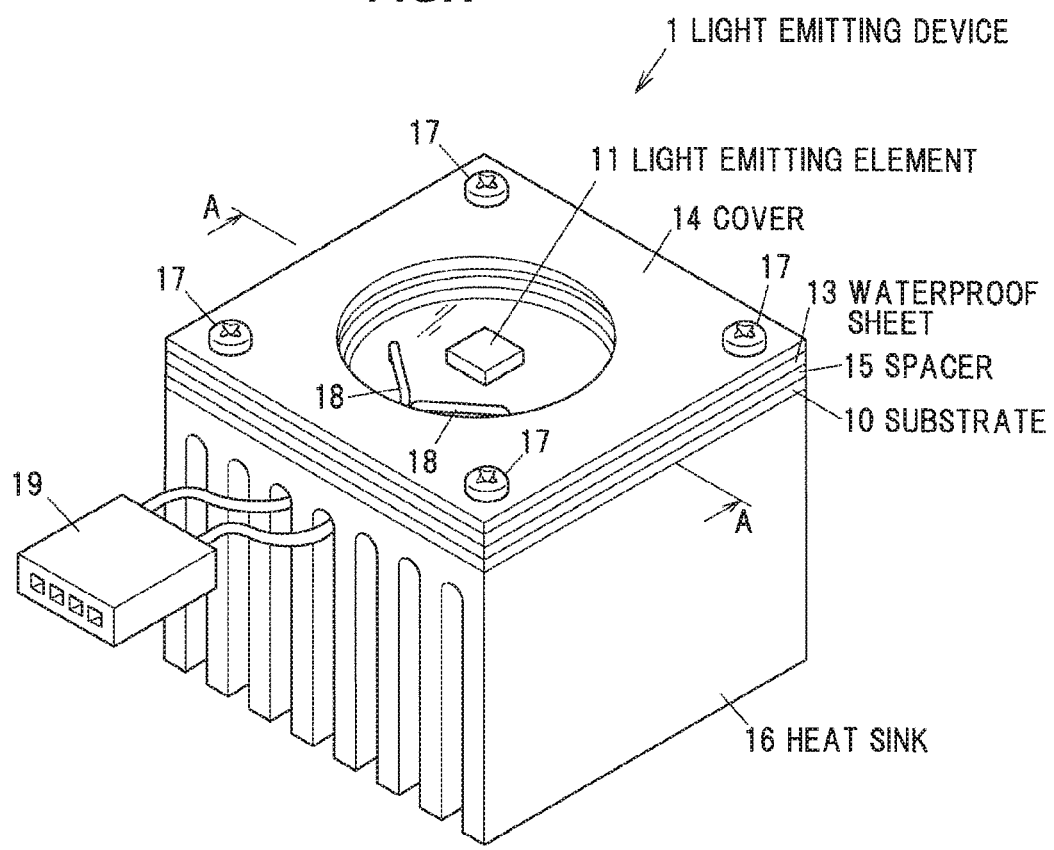
FIG. 1 is a perspective view of a light emitting device according to a first embodiment.
Figure 2:
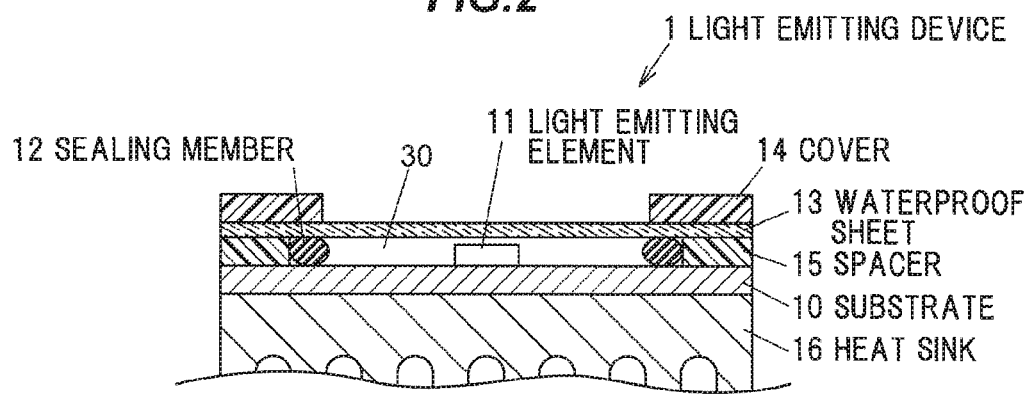
FIG. 2 is a vertical cross-sectional view of the light emitting device taken along section line A-A of FIG. 1.
Figure 3:
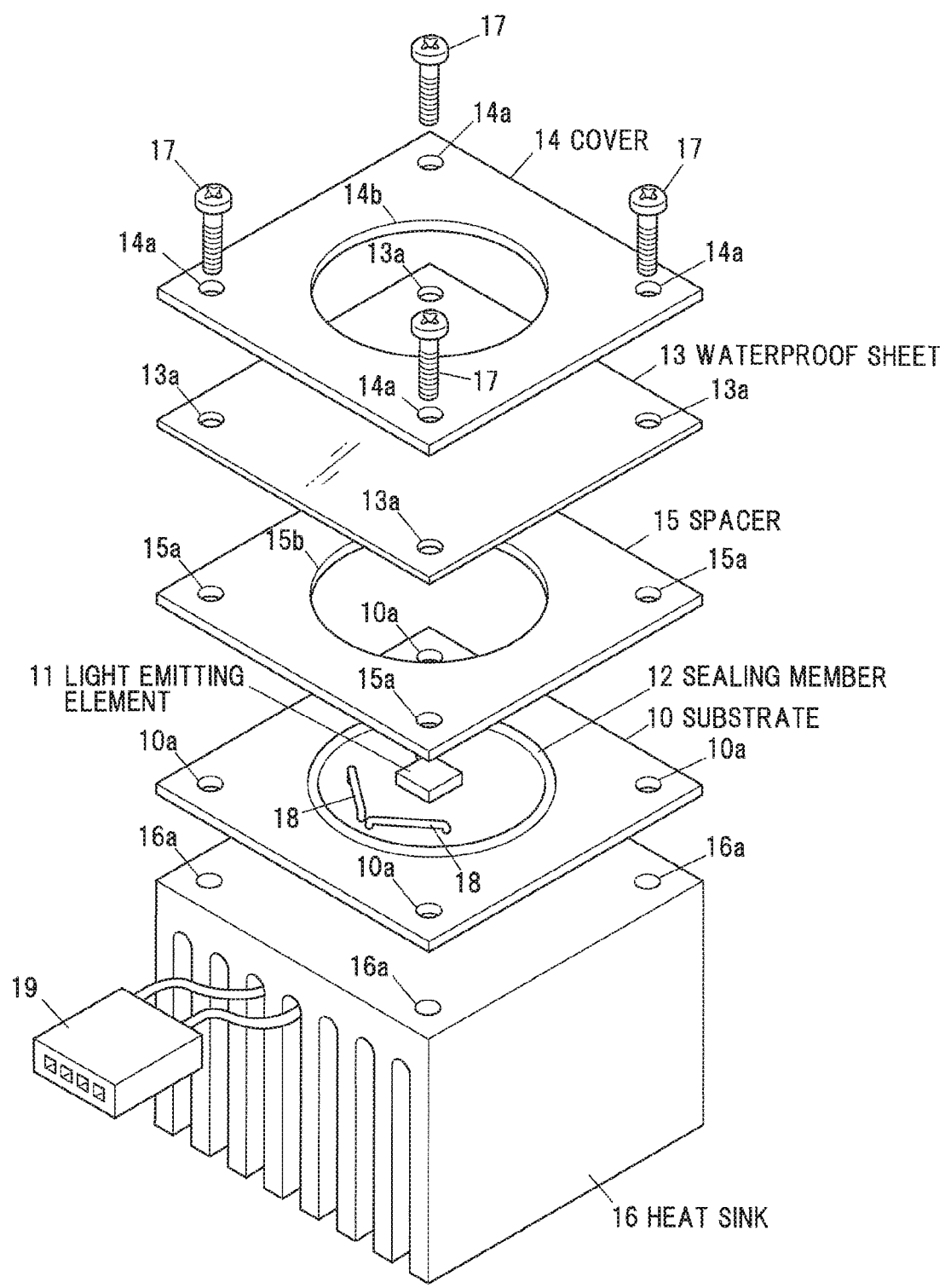
FIG. 3 is an exploded perspective view of the light emitting device according to the first embodiment.

FIG. 1 is a perspective view of a light emitting device 1 according to a first embodiment. FIG. 2 is a vertical cross-sectional view of the light emitting device 1 cut along a cutting line A-A of FIG. 1. FIG. 3 is an exploded perspective view of the light emitting device 1.

The light emitting device 1 includes a substrate 10, a light emitting element 11 mounted on the substrate 10, an uninterrupted annular sealing member 12 installed in such a manner as to surround the light emitting element 11, a waterproof sheet (film) 13 installed in such a manner as to cover an upper side of the light emitting element 11 and the sealing member 12, and transmit light emitted from the light emitting element 11, and an uninterrupted annular cover 14 installed on the waterproof sheet 13, with a region of the cover 14 being open above the light emitting element 11.

In the light emitting device 1, the waterproof sheet 13 is fixed by sandwiching the waterproof sheet 13 between the sealing member 12 and the cover 14. Further, in the light emitting device 1, a mounting region 30 for the light emitting element 11 on the substrate 10, which is being laterally surrounded by the sealing member 12 while being covered by the waterproof sheet 13, is being hermetically sealed.

The substrate 10 is configured as a wiring substrate having a wiring connected to electrodes of the light emitting element 11. A harness 18 is connected to the wiring of the substrate 10, and is provided with a harness connector 19 at an end portion of the harness 18 extending to an outer side of the hermitically sealed mounting region for the light emitting element 11.

The substrate 10 is preferably configured as a good heat conducting substrate such as an alumina substrate or an aluminum substrate (an aluminum plate covered with an insulating resist) in order to efficiently dissipate heat generated from the light emitting element 11. Further, as shown in FIG. 1 and the like, it is preferable to provide a heat sink 16 on the back side of the substrate 10 (the opposite side of the light emitting element 11) in order to enhance the heat dissipation. Note that when the light emitting device 1 is used in water, no heat sink 16 may be included.

The light emitting element 11 is configured as, for example, an LED or an LD (Laser Diode), and typically, an LED is used. The LED is a small-sized light emitting element, and is low in power consumption and in amount of heat generation, and long in life, and therefore suitable for use as the light emitting element 11. The light emitting device 1 may have one light emitting element 11 or may have a plurality of light emitting elements 11.

The emission wavelength of the light emitting element 11 is not particularly limited, but when emitting ultraviolet light, the light emitting device 1 can be used as a sterilizer. In this case, as the ultraviolet light to be emitted from the light emitting element 11, there are, for example, ultraviolet light in a wavelength range (400 to 315 nm) called UV-A, ultraviolet light in a wavelength range (315 to 280 nm) called UV-B, and ultraviolet light in a wavelength range (shorter than 280 nm) called UV-C, and of these, the UV-C that has the highest sterilizing effect is preferred.

When the light emitting element 11 emits visible light, the light emitting device 1 can be used as an illumination lamp, for example.

The sealing member 12 is configured as, for example, an O-ring, a packing, or a sheet-like member having an opening, and fulfills its sealing function by being moderately compressed in its thickness direction.

It is preferable that the thickness of the sealing member 12 after being set in the light emitting device 1, in other words, the thickness thereof after being compressed is 65 to 95% of the thickness thereof before being set in the light emitting device 1, in other words, the thickness thereof before being compressed. If it is less than 65% of the thickness before being compressed, the cracking of the sealing member 12 may be caused by excessive pressurization. If it exceeds 95% of the thickness before being compressed, the sealability is poor, and for example, when it is immersed in water, the ingress of water thereinto (into the mounting region 30 for the light emitting element 11) may occur.

The waterproof sheet 13 has the property of transmitting the light emitted from the light emitting element 11. For this reason, the material for the waterproof sheet 13 is selected according to the emission wavelength of the light emitting element 11. For example, when the light emitting element 11 emits light in the UV-C wavelength range, a fluorine resin film is used as the waterproof sheet 13.

Further, the waterproof sheet 13 has the property of being deformed by a load. For this reason, the waterproof sheet 13 is deformed by temperature variation and external force, to thereby be able to relax the pressure variation inside (in the mounting region 30 for the light emitting element 11), and ensure airtightness. In this regard, the waterproof sheet 13 is superior to a lens made of non-deforming quartz glass or sapphire.

Further, the waterproof sheet 13 is low in heat insulating efficiency, as compared to a lens made of quartz glass or sapphire, and can therefore suppress heat trapping inside (in the mounting region 30 for the light emitting element 11).

The cover 14 has an opening 14b, which is located above the light emitting element 11. The light emitted from the light emitting element 11 is transmitted through the waterproof sheet 13 and is extracted from the opening 14b of the cover 14. The cover 14 is preferably made of a material that is not deteriorated by the light emitted from the light emitting element 11, and is made of aluminum (Al), for example. The material of the cover 14 can be selected in accordance with the emission wavelength of the light emitting element 11.

In the light emitting device 1, an upper portion of the sealing member 12 and a lower portion of the waterproof sheet 13 are in contact with each other, and the sealing member 12 and the waterproof sheet 13 are sandwiched between the substrate 10 and the cover 14 in such a manner as to thereby fix the waterproof sheet 13, while compressing the sealing member 12 to fulfill the sealing function.

The spacer 15 is installed on an outer side of the sealing member 12 and acts as a stopper when the sealing member 12 is compressed in the thickness direction. This makes it possible to adjust the amount of compression of the sealing member 12 with the thickness of the spacer 15. In order to set the thickness of the sealing member 12 after being compressed at 65 to 95% of the thickness thereof before being compressed, the thickness of the spacer 15 is set at 65 to 95% of the thickness of the sealing member 12 before being compressed.

The spacer 15 is configured as a sheet-like spacer having the same shape as that of the cover 14. The spacer 15 has an opening 15b, which is located above the light emitting element 11. By matching the shapes and sizes of the opening 15b and the sealing member 12 to each other, it is also possible to perform the positioning of the sealing member 12 with the spacer 15. The spacer 15 is made of Al, for example.

Figure 4:
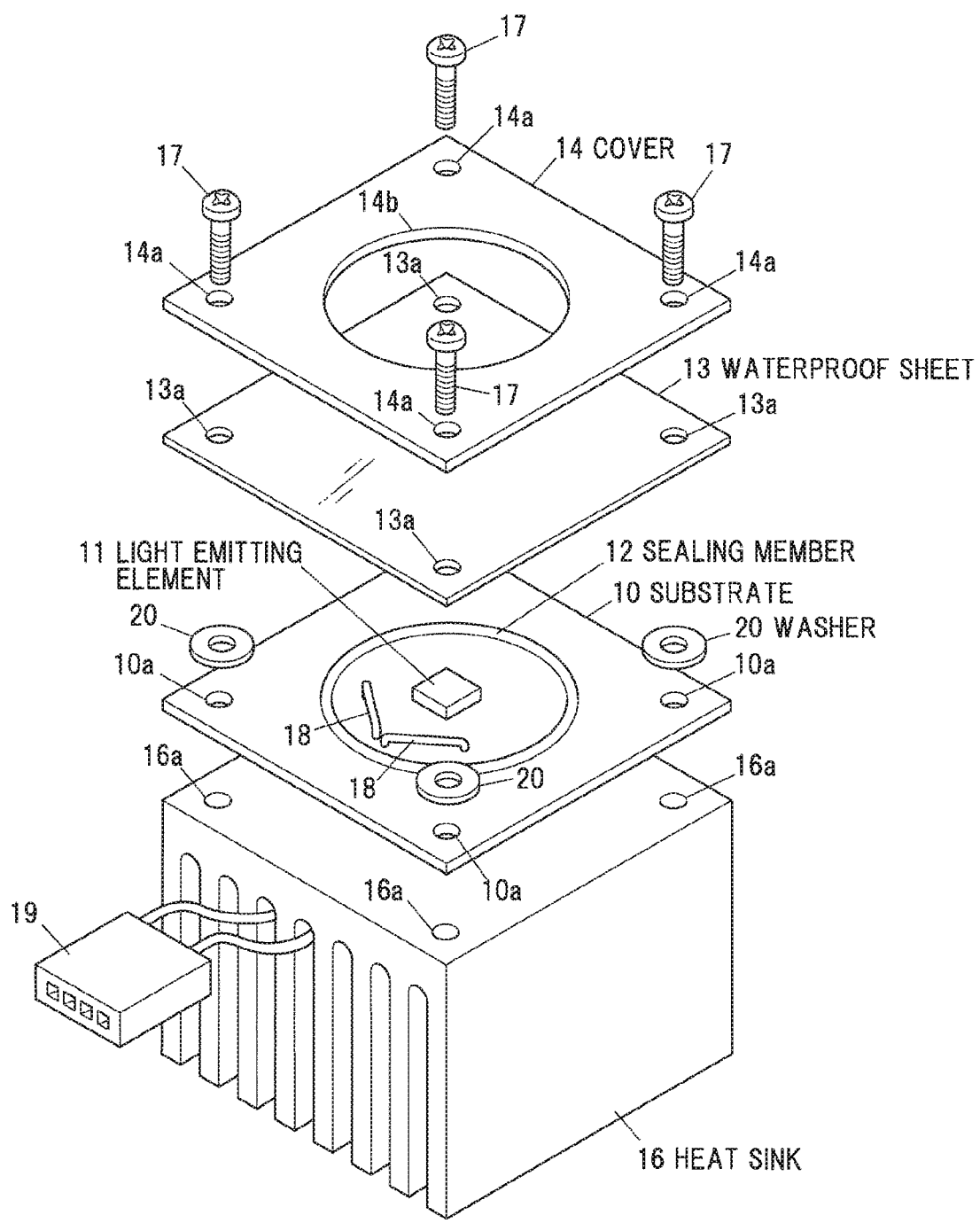
FIG. 4 is an exploded perspective view of a modification to the light emitting device according to the first embodiment.

FIG. 4 is an exploded perspective view of a modification to the light emitting device 1 in which a washer 20 is used as a spacer in place of the spacer 15. The washer 20 has a thickness of the same order as that of the spacer 15 and acts as the spacer in the same manner as the spacer 15. In this manner, a member other than the spacer 15 may be used as the spacer.

In the light emitting device 1, the cover 14, the waterproof sheet 13, the spacer 15, the substrate 10, and the heat sink 16 have their respective threaded holes 14a, 13a, 15a, 10a, and 16a for screwing, and are screwed with fixing screws 17. The waterproof sheet 13 is sandwiched and fixed between the sealing member 12 and the cover 14 by screwing.

Note that those members may be fixed by welding or bonding using an adhesive, instead of screwing using the fixing screws 17. Even in this case, the waterproof sheet 13 is fixed by being sandwiched between the sealing member 12 and the cover 14. This makes it possible to prevent the separation of the waterproof sheet 13 due to water pressure and the like, even when the light emitting device 1 is immersed in water, for example.

FIG. 5 is a plan view of a modification to the waterproof sheet 13. In this modification, the threaded holes 13a are configured not in a perfect circle shape, but in a rounded corner rectangle shape extending toward a central portion of the waterproof sheet 13.

In this case, when the waterproof sheet 13 is deformed due to an external force, a temperature variation or the like, the entire waterproof sheet 13 can follow and move to some extent, so that the waterproof sheet 13 can be prevented from being damaged. Note that even in this case, the sealability is sufficiently ensured by the contact between the waterproof sheet 13 and the sealing member 12.

Second Embodiment

A second embodiment of the present invention differs from the first embodiment in that the side surface of the waterproof sheet 13 is covered by a light intercepting member which does not transmit light emitted from the light emitting element 11. Note that the same members as those of the first embodiment are given the same reference characters, and descriptions thereof are omitted or simplified.

Figure 6A:
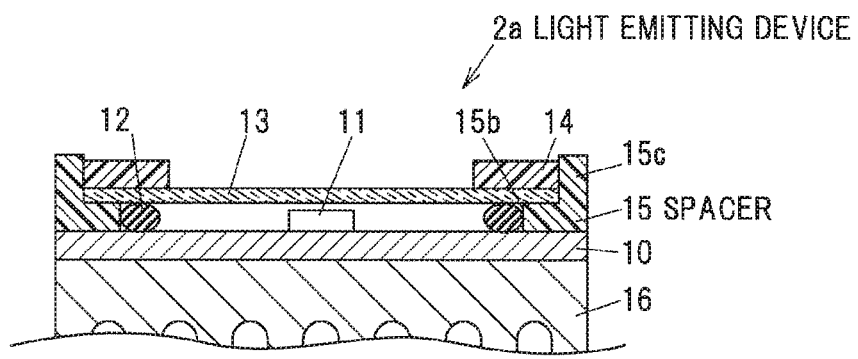
FIGS. 6A-6C are vertical cross-sectional views of a light emitting device according to a second embodiment.
Figure 6B:
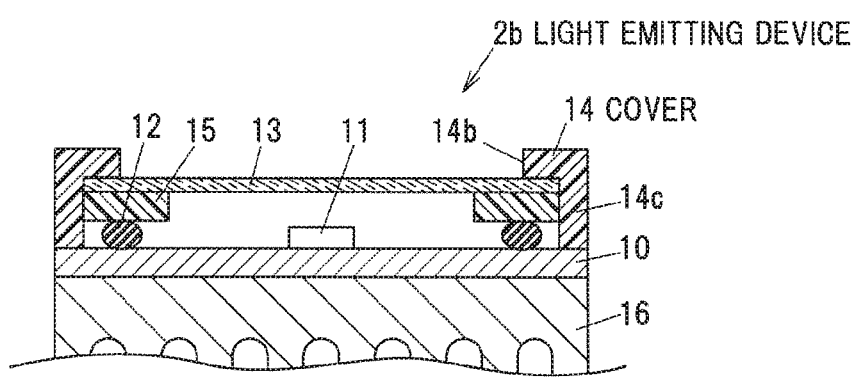
Figure 6C:
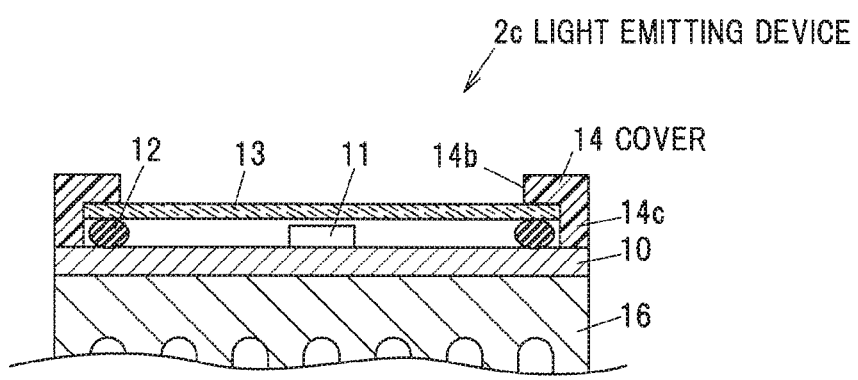

FIGS. 6A to 6C are vertical cross-sectional views of light emitting devices 2a to 2c according to the second embodiment. The locations of the cross sections of the light emitting devices 2a to 2c shown in FIGS. 6A to 6C correspond to the location of the cross section of the light emitting device 1 shown in FIG. 2.

In the light emitting device 2a shown in FIG. 6A, the spacer 15 acts as a light intercepting member to cover the side surface of the waterproof sheet 13. In this case, for example, the spacer 15 has an annular side wall section 15c, which surrounds the waterproof sheet 13 and the cover 14, and has a recess shape with a bottom surface being open (with an opening 15b in its bottom surface). In the light emitting device 2a, it is also possible to perform the positioning of the sealing member 12 with the spacer 15 by matching the shapes and sizes of the opening 15b and the sealing member 12 to each other.

In the light emitting device 2b shown in FIG. 6B, the cover 14 acts as a light intercepting member to cover the side surface of the waterproof sheet 13. In this case, for example, the cover 14 has an annular side wall section 14c, which surrounds the waterproof sheet 13, the spacer 15, and the sealing member 12, and has an inverted recess shape with a top surface being open (with an opening 14b in its top surface). Note that, in the light emitting device 2b, the spacer 15 is being provided on the sealing member 12, while the waterproof sheet 13 is being sandwiched and fixed between the spacer 15 and an upper wall section of the cover 14.

In the light emitting device 2c shown in FIG. 6C, as with the light emitting device 2b, the cover 14 acts as a light intercepting member to cover the side surface of the waterproof sheet 13, but the light emitting device 2c differs from the light emitting device 2b in that the light emitting device 2c has no spacer 15. In the light emitting device 2c, an upper wall section of the cover 14 is covering a directly upper side of the sealing member 12, while the waterproof sheet 13 is being sandwiched and fixed between the upper wall section of the cover 14 and the sealing member 12.

Third Embodiment

A third embodiment of the present invention differs from the first embodiment in that a side wall for supporting the waterproof sheet 13 is provided between the light emitting element 11 and the sealing member 12. Note that the same members as those of the first embodiment are given the same reference characters, and descriptions thereof are omitted or simplified.

Figure 7A:
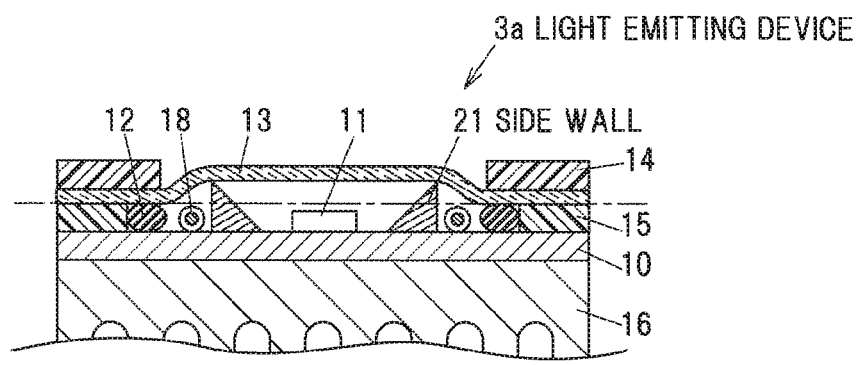
FIGS. 7A-7C are vertical cross-sectional views of a light emitting device according to a third embodiment.
Figure 7B:
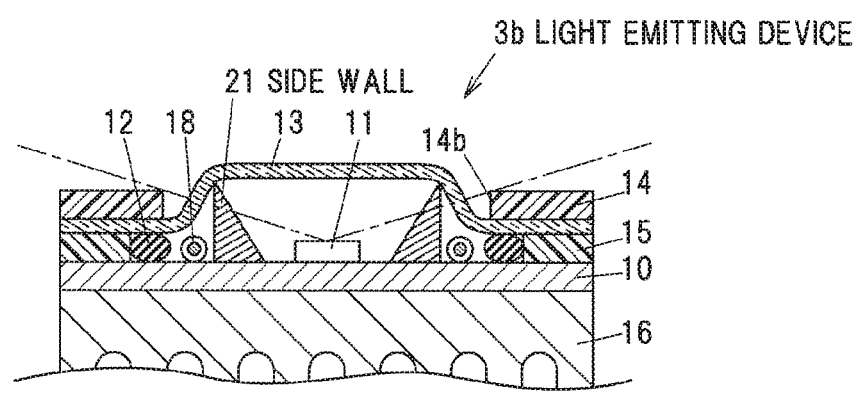
Figure 7C:
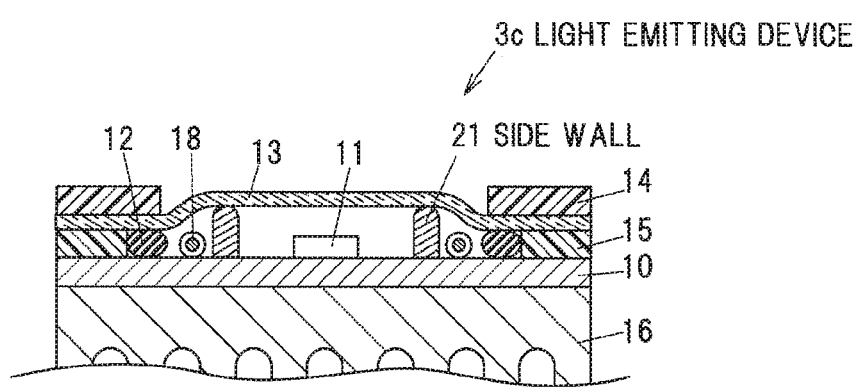

FIGS. 7A to 7C are vertical cross-sectional views of light emitting devices 3a to 3c according to the third embodiment. The locations of the cross sections of the light emitting devices 3a to 3c shown in FIGS. 7A to 7C correspond to the location of the cross section of the light emitting device 1 shown in FIG. 2. Note that, in FIG. 7A to 7C, in order to show the locational relationship between the side wall 21 and the member on the outer side thereof, for convenience, there is shown a cross section of the harness 18 which does not originally appear.

The side wall 21 is installed between the light emitting element 11 on the substrate 10 and the sealing member 12.

The dashed dotted line in FIG. 7A indicates a height of the contact portion between the waterproof sheet 13 and the sealing member 12. As shown in FIG. 7A, an upper end of the side wall 21 is located higher than the contact portion between the waterproof sheet 13 and the sealing member 12, so the upper end of the side wall 21 is in contact with the waterproof sheet 13. For this reason, the side wall 21 can support the waterproof sheet 13 so that the waterproof sheet 13 is not brought into contact with the light emitting element 11 when the waterproof sheet 13 is deformed by an external force and the like.

Further, by allowing the side wall 21 to slightly tension the waterproof sheet 13, it is possible to reduce the amount of deformation of the waterproof sheet 13 due to an external force and the like to a preferable range. When the waterproof sheet 13 is tensioned by the side wall 21, in order to suppress damage to the waterproof sheet 13, it is preferable that the threaded hole 13a of the waterproof sheet 13 have a shape as shown in FIG. 5.

Further, the side wall 21 preferably does not transmit light emitted from the light emitting element 11. In particular, when the light emitted from the light emitting element 11 is ultraviolet light (especially, ultraviolet light in the UV-C wavelength range), in order to suppress light degradation (degradation caused by being subjected to the light emitted from the light emitting element 11) of the members such as the sealing member 12 and the harness 18 installed on the outer side of the side wall 21 on the substrate 10, it is strongly required that the side wall 21 does not transmit the light emitted from the light emitting element 11.

When the light emitted from the light emitting element 11 is ultraviolet light, the side wall 21 is preferably made of a material having a high reflectance to ultraviolet light, such as Al or polytetrafluoroethylene (PTFE). Alternatively, the surface of the side wall 21 may be subjected to surface treatment such as Al plating to enhance the reflectance to ultraviolet light. By enhancing the reflectance, the light amount of the light emitting device 3a can be increased.

Further, in this case, it is preferable that all the circuit components including the harness 18 and the like be arranged on the outer side of the side wall 21 in order to prevent exposure to the ultraviolet light. Further, in order to more effectively suppress the light degradation of these circuit components, it is preferable that the upper end of the side wall 21 be located higher than these circuit components.

Further, as shown in FIG. 7A, the side wall 21 is preferably inclined in such a manner that the side surface on the inner side (the light emitting element 11 side) is oriented upward. In this case, the light emitted from the light emitting element 11 and directed to the side wall 21 is reflected upward by the side wall 21. That is, it is possible to allow the side wall 21 to act as a reflector. Note that the inclination angle of the inner side surface of the side wall 21 can appropriately be set in accordance with the irradiation angle of the light emitting device 1 and the like.

To support the waterproof sheet 13 described above, to suppress the light deterioration of the member installed on the outer side of the side wall 21 and to increase the effect of the reflector, the side wall 21 is configured preferably as an annular member and particularly preferably as an uninterrupted annular member to surround the light emitting element 11.

The alternate long and short dash line in FIG. 7B indicates a straight line connecting an upper end of the light emitting element 11 and an open end of the cover 14 (an upper end of a rim of the opening 14b). As shown in FIG. 7B, the upper end of the side wall 21 of the light emitting device 3b is located in the upper side of the straight line connecting the upper end of the light emitting element 11 and the open end of the cover 14. This makes it possible to suppress the light deterioration of the members installed on the outer side of the side wall 21 including the cover 14 installed at the highest position.

In the light emitting device 3c shown in FIG. 7C, an upper end of the side wall 21, that is, a contact portion thereof with the waterproof sheet 13 has an R shape (is configured as a curved surface). This makes it possible to enhance the durability against the friction between the upper end of the side wall 21 and the waterproof sheet 13 when the waterproof sheet 13 is acted on by an external force, or expanded or contracted. In order to effectively enhance the durability against the friction, the radius of the R-shaped portion at the upper end of the side wall 21 is preferably 0.5 mm or more. Note that even when the upper end of the side wall 21 has an R shape, the inner side surface can be inclined in order to allow the side wall 21 to act as a reflector.

Fourth Embodiment

A fourth embodiment of the present invention differs from the first embodiment in that a lens to cover the upper side of the light emitting element 11 is being provided within the mounting region 30 for the light emitting element 11. Note that the same members as those of the first embodiment are given the same reference characters, and descriptions thereof are omitted or simplified.

Figure 8A:
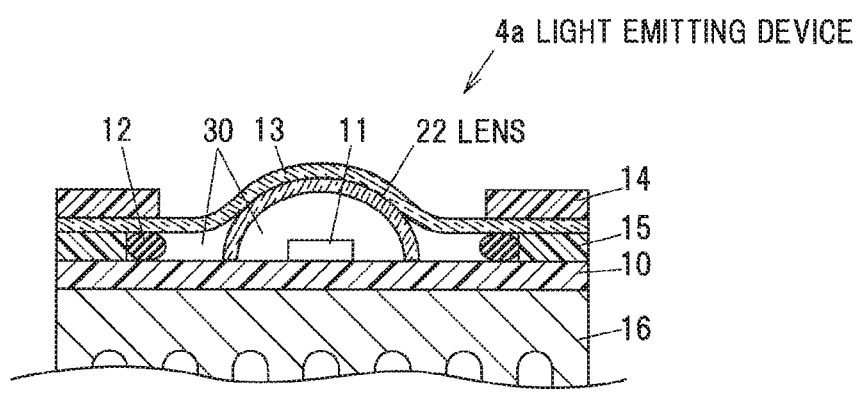
FIGS. 8A and 8B are vertical cross-sectional views of a light emitting device according to a fourth embodiment.

FIG. 8A is a vertical cross-sectional view of a light emitting device 4a having a dome shaped lens 22. The location of the cross section of the light emitting device 4a shown in FIG. 8A corresponds to the location of the cross section of the light emitting device 1 shown in FIG. 2.

The lens 22 covers the upper side and lateral side of the light emitting element 11, and its upper surface is in contact with the waterproof sheet 13. The lens 22 is being fixed in location by being acted on by a downward pressing force of the waterproof sheet 13. This makes it possible to effectively prevent the lens 22 from detaching from the light emitting device 4a even when the pressure in the inner side of the lens 22 is increased.

The lens 22 has the property of transmitting the light emitted from the light emitting element 11. For example, when the light emitted from the light emitting element 11 is ultraviolet light in the UV-C wavelength range, quartz glass, transparent fluororesin, UV-C transmitting glass, or the like can be used as the material of the lens 22.

The lens 22 acts to protect the light emitting element 11 from damage when being acted on by an external force, and acts to control the orientation thereof. On the other hand, since the lens 22 is being covered by the waterproof sheet 13, the lens 22 is being protected from scratches and dirt.

In the light emitting device 4a, the region in the outer side of the lens 22 in the mounting region 30 for the light emitting element 11 is resistant to pressure variation because the waterproof sheet 13 is deformable, and allows the suppression of heat trapping because the waterproof sheet 13 is low in heat insulating efficiency. Further, by providing a hole or a cutout in part of the lens 22 and spatially connecting together the inner side and outer side of the lens 22, it is possible to suppress pressure variation and heat trapping in the inner side of the lens 22.

Figure 8B:
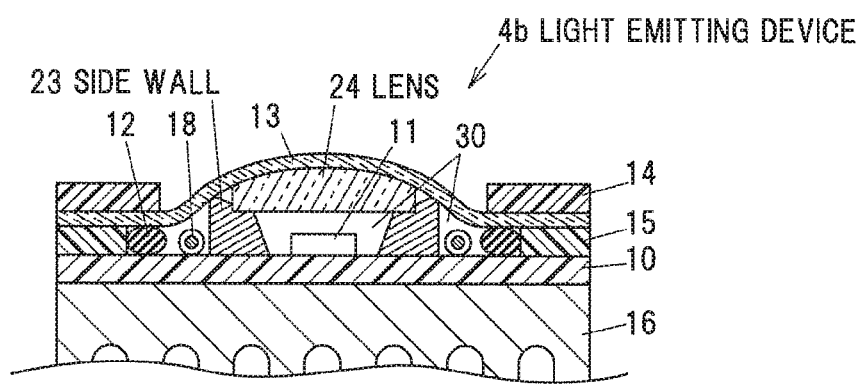

FIG. 8B is a vertical cross-sectional view of a light emitting device 4b having a plate-like lens 24 supported on the side wall 23. The location of the cross section of the light emitting device 4b shown in FIG. 8B corresponds to the location of the cross section of the light emitting device 1 shown in FIG. 2. Note that, in FIG. 8B, in order to show the locational relationship between the side wall 23 and the member on the outer side thereof, for convenience, there is shown a cross section of the harness 18 which does not originally appear.

The lens 24 covers the upper side of the light emitting element 11, and its upper surface is in contact with the waterproof sheet 13. The lens 24 is being fixed in location by being acted on by a downward pressing force of the waterproof sheet 13 and supported on the side wall 23 around its bottom rim. This makes it possible to effectively prevent the lens 24 from detaching from the light emitting device 4b even when the pressure in the inner side of the lens 24 and the side wall 23 is increased.

In addition, since the lens 24 is supported by the side wall 23, the lens 24 is less likely to be misaligned in location, and less likely to collide with and damage the light emitting element 11, than the lens 22 of the light emitting device 4a.

The lens 24 has the property of transmitting the light emitted from the light emitting element 11. For example, when the light emitted from the light emitting element 11 is ultraviolet light in the UV-C wavelength range, quartz glass, transparent fluororesin, UV-C transmitting glass, or the like can be used as the material of the lens 24.

The lens 24 acts to protect the light emitting element 11 from damage when being acted on by an external force, and acts to control the orientation thereof. On the other hand, since the lens 24 is being covered by the waterproof sheet 13, the lens 24 is being protected from scratches and dirt.

The shape of the lens 24 is configured as, for example, a convex shape, a Fresnel shape, or a cylindrical shape.

Further, the side wall 23 preferably does not transmit light emitted from the light emitting element 11. In particular, when the light emitted from the light emitting element 11 is ultraviolet light (especially, ultraviolet light in the UV-C wavelength range), in order to suppress light degradation of the members such as the sealing member 12 and the harness 18 installed on the outer side of the side wall 23 on the substrate 10, it is strongly required that the side wall 23 does not transmit the light emitted from the light emitting element 11.

When the light emitted from the light emitting element 11 is ultraviolet light, the side wall 23 is preferably made of a material having a high reflectance to ultraviolet light, such as Al or polytetrafluoroethylene (PTFE). Alternatively, the surface of the side wall 23 may be subjected to surface treatment such as Al plating to enhance the reflectance to ultraviolet light. By enhancing the reflectance, the light quantity of the light emitting device 4b can be increased.

Further, in this case, it is preferable that all the circuit components including the harness 18 and the like be arranged on the outer side of the side wall 23 in order to prevent exposure to ultraviolet light. Further, in order to more effectively suppress the light deterioration of these circuit components, it is preferable that the upper end of the side wall 23 be located higher than these circuit components.

Further, when the side surface on the inner side (the light emitting element 11 side) of the side wall 23 is inclined in such a manner as to be oriented upward, the light emitted from the light emitting element 11 and directed to the side wall 23 can be reflected upward. That is, it is possible to allow the side wall 23 to act as a reflector.

In the light emitting device 4b, the region in the outer side of the lens 24 and the side wall 23 in the mounting region 30 for the light emitting element 11 is resistant to pressure variation because the waterproof sheet 13 is deformable, and allows the suppression of heat trapping because the waterproof sheet 13 is low in heat insulating efficiency. Further, by providing a hole or a cutout in part of the lens 24 or the side wall 23 and spatially connecting together the inner side and outer side of the lens 24 and the side wall 23, it is possible to suppress pressure variation and heat trapping in the inner side of the lens 24 and the side wall 23.

Advantageous Effects of the Embodiments

According to the first to fourth embodiments, it is possible to provide the light emitting devices that are resistant to pressure variation in the hermitically sealed mounting region for the light emitting element, and that are waterproofed to be usable in water as well. The light emitting devices according to the first to fourth embodiments can be used as a sterilizer (when emitting ultraviolet light) or as an illumination lamp (when emitting visible light).

When using the light emitting devices according to the first to fourth embodiments as a sterilizer, it is possible to irradiate ultraviolet light to, for example, a pipe made of a material that transmits ultraviolet light, such as quartz glass or fluorine resin, and thereby sterilize a fluid flowing in that pipe. Although the use thereof as a sterilizer for fluid in this manner is often performed under a high moisture environment, since the light emitting devices according to the first to fourth embodiments are highly waterproofed, it is possible to prevent the ingress of the water thereinto.

In addition, the light emitting devices according to the first to fourth embodiments can also be used as a sterilizer that emits ultraviolet light with them being immersed in a fluid to sterilize that fluid. Even in this case, since the light emitting devices according to the first to fourth embodiments are highly waterproofed, it is possible to prevent the ingress of the water thereinto, and further since the waterproof sheet is being securely fixed, it is possible to prevent damage thereto due to water pressure and the like.

Although the embodiments of the present invention have been described above, this invention is not limited to the above-described embodiments, but various modifications can be implemented without deviating from the spirit of the invention. Further, any combinations of the constituent elements of the above-described embodiments can be made without departing from the spirit of the invention.

Further, the embodiments described above are not to be construed as limiting the inventions according to the claims. It should also be noted that not all combinations of the features described in the embodiments are indispensable to the means for solving the problem of the invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

DESCRIPTIONS OF THE REFERENCE CHARACTERS 1, 2a, 2b, 2c, 3a, 3b, 3c, 4a, 4b Light emitting device
10 Substrate
11 Light emitting element
12 Sealing member
13 Waterproof sheet
14 Cover
15 Spacer
14c, 15c Side wall section
21 Side wall
22, 24 Lens

What is claimed is:
1. A light emitting device, including:
a substrate;
a light emitting element mounted on the substrate;
an annular sealing member installed in such a manner as to surround the light emitting element;
a waterproof sheet installed in such a manner as to cover an upper side of the light emitting element and the sealing member such that, in a plan view, the waterproof sheet overlaps with the light emitting element and an entirety of the sealing member, and transmits light emitted from the light emitting element; and
an annular cover installed on the waterproof sheet, with a region of the cover being open above the light emitting element,
wherein the waterproof sheet is being fixed by sandwiching the waterproof sheet between the sealing member and the cover,
wherein a mounting region for the light emitting element on the substrate, which is being laterally surrounded by the sealing member while being covered by the waterproof sheet, is being hermetically sealed such that a bottommost surface of the sealing member is coplanar with a bottom surface of the light emitting element, and
wherein the waterproof sheet comprises a fluorine resin film.
2. The light emitting device according to claim 1, further including a light intercepting member, which covers a side surface of the waterproof sheet to intercept the light emitted from the light emitting element.

3. The light emitting device according to claim 1, further including a side wall, which is installed between the light emitting element and the sealing member,
    wherein the side wall is greater in height than the light emitting element, with an upper end of the side wall being in contact with the waterproof sheet.

4. The light emitting device according to claim 2, further including a side wall, which is installed between the light emitting element and the sealing member, wherein the side wall is greater in height than the light emitting element, with an upper end of the side wall being in contact with the waterproof sheet.

5. The light emitting device according to claim 1, further including a lens, which covers the upper side of the light emitting element, with an upper surface of the lens being in contact with the waterproof sheet, with the lens to transmit the light emitted from the light emitting element,
    wherein a position of the lens is being fixed with the waterproof sheet,
    wherein the lens has a convex shape, a Fresnel shape, or a cylindrical shape, and
    wherein the lens comprises a light-extracting surface to extract the emitted light therethrough, the light-extracting surface being in contact with the waterproof sheet.

6. The light emitting device according to claim 2, further including a lens, which covers the upper side of the light emitting element, with an upper surface of the lens being in contact with the waterproof sheet, with the lens to transmit the light emitted from the light emitting element,
    wherein a position of the lens is being fixed with the waterproof sheet,
    wherein the lens has a convex shape, a Fresnel shape, or a cylindrical shape, and
    wherein the lens comprises a light-extracting surface to extract the emitted light therethrough, the light-extracting surface being in contact with the waterproof sheet.

7. The light emitting device according to claim 3, further including a lens, which covers the upper side of the light emitting element, with an upper surface of the lens being in contact with the waterproof sheet, with the lens to transmit the light emitted from the light emitting element,
    wherein a position of the lens is being fixed with the waterproof sheet,
    wherein the lens has a convex shape, a Fresnel shape, or a cylindrical shape, and
    wherein the lens comprises a light-extracting surface to extract the emitted light therethrough, the light-extracting surface being in contact with the waterproof sheet.

8. The light emitting device according to claim 1, wherein the sealing member is being compressed in a thickness direction, and a thickness of the sealing member after being compressed is 65% to 95% of that before being compressed.

9. The light emitting device according to claim 2, wherein the sealing member is being compressed in a thickness direction, and a thickness of the sealing member after being compressed is 65% to 95% of that before being compressed.

10. The light emitting device according to claim 3, wherein the sealing member is being compressed in a thickness direction, and a thickness of the sealing member after being compressed is 65% to 95% of that before being compressed.

11. The light emitting device according to claim 4, wherein the sealing member is being compressed in a thickness direction, and a thickness of the sealing member after being compressed is 65% to 95% of that before being compressed.

12. The light emitting device according to claim 5, wherein the sealing member is being compressed in a thickness direction, and a thickness of the sealing member after being compressed is 65% to 95% of that before being con pressed.

13. The light emitting device according to claim 1, wherein the light emitting element comprises a sterilizer that emits ultraviolet light.

14. The light emitting device according to claim 2, wherein the light emitting element comprises a sterilizer that emits ultraviolet light.

15. The light emitting device according to claim 3, wherein the light emitting element comprises a sterilizer that emits ultraviolet light.

16. The light emitting device according to claim 4, wherein the light emitting element comprises a sterilizer that emits ultraviolet light.

17. The light emitting device according to claim 5, wherein the light emitting element comprises a sterilizer that emits ultraviolet light.

18. The light emitting device according to claim 1,
    wherein a width direction of the light emitting device, the sealing member overlaps with the light emitting element.

19. The light emitting device according to claim 1, further including a side wall disposed between the light emitting element and the sealing member,
    wherein, with respect to a bottom surface of the substrate, a bottom surface of the side wall has a same height as a bottommost surface of the sealing member, and a top surface of the side wall contacts the waterproof sheet and is located higher than a top surface of the sealing member.

20. A light emitting device, including:
    a substrate;
    a light emitting element mounted on the substrate;
    a sealing member disposed above a top surface of the substrate to surround the light emitting element;
    a waterproof sheet covering an upper side of the light emitting element and the sealing member such that, in a plan view, waterproof sheet overlaps with the light emitting element and an entirety of the sealing member;
    a cover disposed on the waterproof sheet, with a region of the cover being open above the light emitting element, the waterproof sheet being sandwiched between the sealing member and the cover; and
    a spacer disposed above the top surface of the substrate such that, in a width direction of the light emitting device, an outer periphery of the sealing member is exposed to the spacer,
    wherein the waterproof sheet comprises a fluorine resin film, and
    wherein a bottommost surface of the sealing member is coplanar with a bottom surface of the light emitting element.

* * * * *